(12) United States Patent
Hu et al.

(10) Patent No.: US 12,253,755 B2
(45) Date of Patent: Mar. 18, 2025

(54) DISPLAY DEVICE

(71) Applicant: HKC CORPORATION LIMITED, Shenzhen (CN)

(72) Inventors: Xiaogang Hu, Guangdong (CN); Haoxuan Zheng, Guangdong (CN)

(73) Assignee: HKC CORPORATION LIMITED, Shenzhen (CN)

( * ) Notice: Subject to any disclaimer, the term of this patent is extended or adjusted under 35 U.S.C. 154(b) by 183 days.

(21) Appl. No.: 18/087,335

(22) Filed: Dec. 22, 2022

(65) Prior Publication Data
US 2023/0384635 A1 Nov. 30, 2023

(30) Foreign Application Priority Data
May 26, 2022 (CN) .......................... 202210581719.3

(51) Int. Cl.
*G02F 1/00* (2006.01)
*G02F 1/1335* (2006.01)
*G02F 1/13357* (2006.01)
*H05K 1/18* (2006.01)

(52) U.S. Cl.
CPC .. *G02F 1/133603* (2013.01); *G02F 1/133608* (2013.01); *G02F 1/133612* (2021.01); *H05K 1/189* (2013.01); *H05K 2201/10136* (2013.01)

(58) Field of Classification Search
CPC ...................................................... H05K 1/189
See application file for complete search history.

(56) References Cited

U.S. PATENT DOCUMENTS

| | | | | |
|---|---|---|---|---|
| 8,284,344 B2 * | 10/2012 | Harada | ............. | G02F 1/133308 349/58 |
| 2009/0284681 A1 * | 11/2009 | Inoue | .................. | G02F 1/13452 349/150 |
| 2017/0205659 A1 | 7/2017 | Chien et al. | | |

FOREIGN PATENT DOCUMENTS

| | | |
|---|---|---|
| CN | 106526963 A | 3/2017 |
| CN | 107728365 A | 2/2018 |
| CN | 110646991 A | 1/2020 |
| CN | 111025755 A | 4/2020 |
| CN | 113064292 A | 7/2021 |
| KR | 101834350 B1 * | 3/2018 ....... G02F 1/133308 |

OTHER PUBLICATIONS

The first office action issued in corresponding CN application No. 202210581719.3 dated Feb. 8, 2023.

* cited by examiner

*Primary Examiner* — Gerald J Sufleta, II
(74) *Attorney, Agent, or Firm* — HAUPTMAN HAM, LLP

(57) ABSTRACT

A display device is provided in the disclosure. The display device includes a backlight module, a display panel, a first support structure, a printed circuit board (PCB), and a flexible circuit board (FCB). The display panel is disposed on a light-emitting side of the backlight module and includes a first substrate and a second substrate. The first substrate is located between the second substrate and the backlight module. The second substrate extends beyond the first substrate from a side of the second substrate to form an extension portion. The first support structure is disposed on a side of the backlight module and configured to support the extension portion. The PCB is disposed on the first support structure. The FCB is electrically connected to the display panel and the PCB.

18 Claims, 10 Drawing Sheets

DISPLAY DEVICE

CROSS-REFERENCE TO RELATED APPLICATIONS

This application claims priority under 35 U.S.C. § 119 (a) to Chinese Patent Application No. 202210581719.3, filed May 26, 2022, the entire disclosure of which is incorporated herein by reference.

TECHNICAL FIELD

The disclosure relates to the field of display technology, and particularly to a display device.

BACKGROUND

With the development of display technology, narrow-bezel or bezel-less display devices have the advantages of simplicity, beauty, and a large screen-to-body ratio, and have become a trend of display devices. A traditional display device is provided with a middle frame for supporting a display panel and a front frame for covering edges of the display panel. However, the middle frame and the front frame may occupy a bezel space of the display device, which results in that a narrow bezel or bezel-less design of the display device cannot be realized. In addition, a printed circuit board in the traditional display device is disposed on the back of a rear plane of the display device, resulting in a relatively great overall thickness of the display device, which is unfavorable for a thin and light design of the display device.

SUMMARY

A display device is provided in the embodiments of the disclosure. The display device includes a backlight module, a display panel, a first support structure, a printed circuit board (PCB), and a flexible circuit board (FCB). The display panel is disposed on a light-emitting side of the backlight module and includes a first substrate and a second substrate. The first substrate is located between the second substrate and the backlight module. The second substrate extends beyond the first substrate from a side of the second substrate to form an extension portion. The first support structure is disposed on a side of the backlight module and configured to support the extension portion. The PCB is disposed on the first support structure. The FCB is electrically connected to the display panel and the PCB. The FCB is sandwiched between the first support structure and the extension portion at one end of the FCB and extends to the PCB at the other end of the FCB.

BRIEF DESCRIPTION OF THE DRAWINGS

To describe the technical solutions in the embodiments of the disclosure more clearly, the following briefly introduces the accompanying drawings required for describing the embodiments. Apparently, the accompanying drawings in the following description illustrate some embodiments of the disclosure. Those of ordinary skill in the art may also obtain other drawings based on these accompanying drawings without creative efforts.

The following detailed description will further illustrate the disclosure in conjunction with the above-mentioned drawings.

DETAILED DESCRIPTION OF ILLUSTRATED EMBODIMENTS

The technical solutions in the embodiments of the disclosure are clearly and completely described in the following with reference to the accompanying drawings in the embodiments of the disclosure. Apparently, the described embodiments are merely a part of rather than all the embodiments of the disclosure. All other embodiments obtained by those of ordinary skill in the art based on the embodiments of the disclosure without creative efforts are within the scope of the disclosure.

It can be understood that, the term "and/or" used in the disclosure and the appended claims refers to and include any and all possible combinations of one or more of associated listed items.

Figure 1:
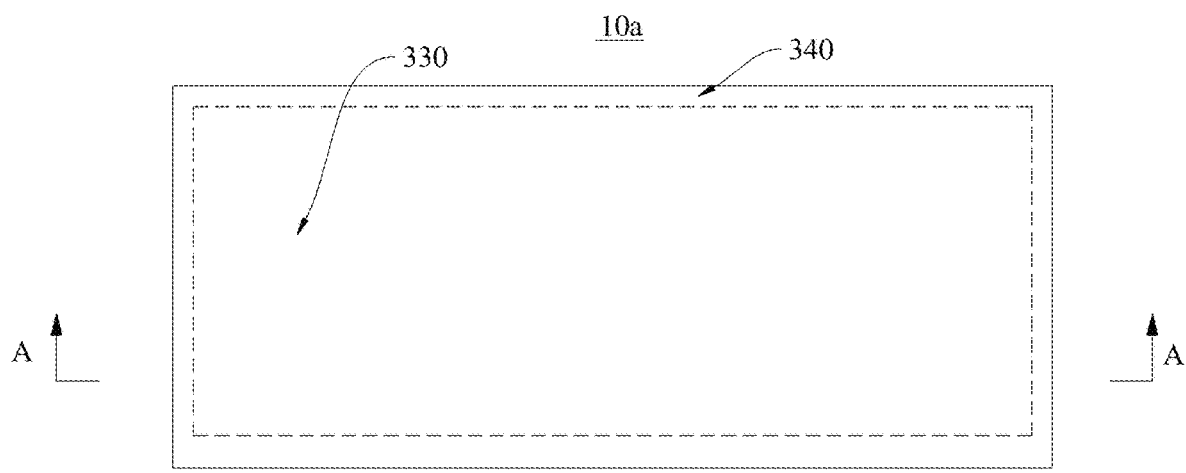
FIG. 1 is a schematic structural view of a display device provided in some embodiments of the disclosure.
Figure 2:
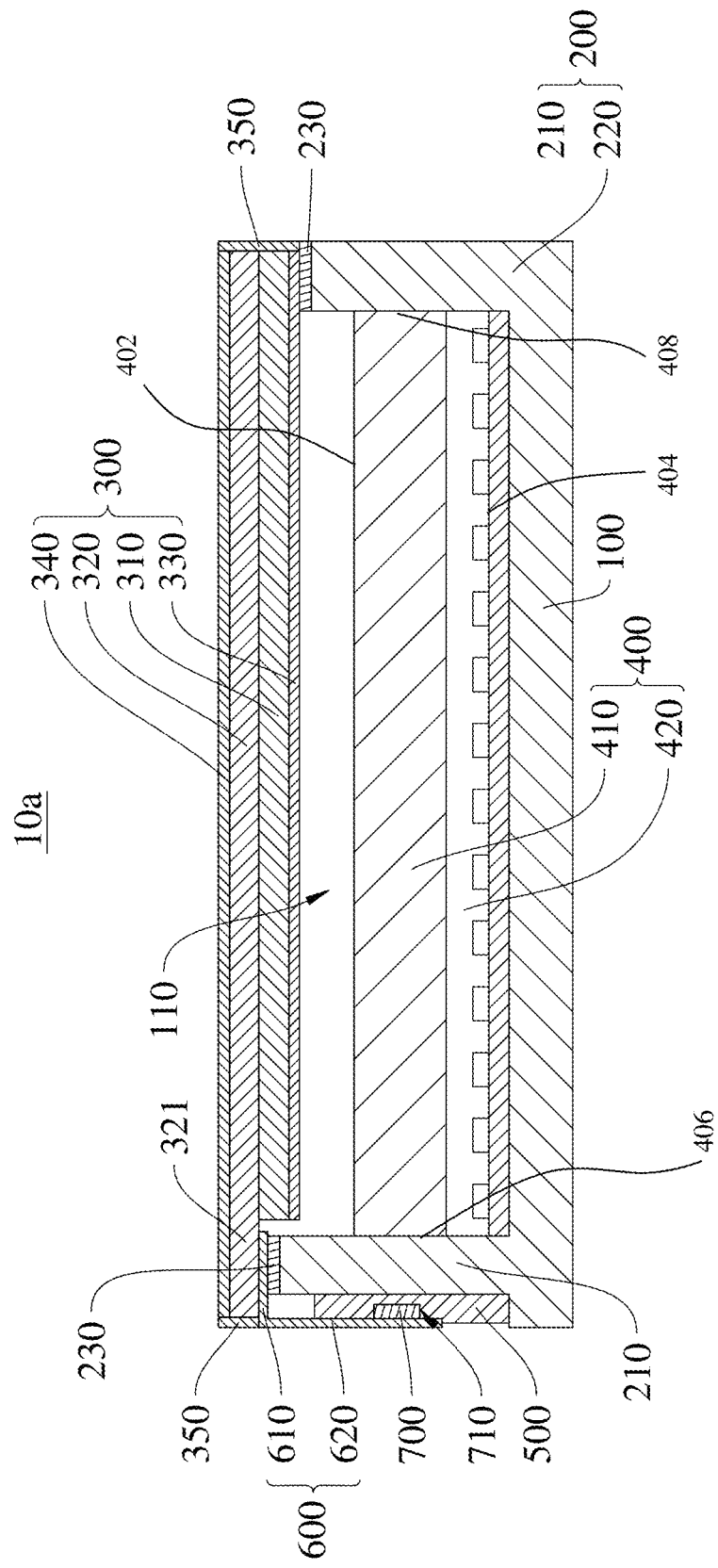
FIG. 2 is a cross-sectional view of the display device along line A-A in FIG. 1.

Refer to FIG. 1 and FIG. 2, FIG. 1 is a schematic structural view of a display device 10a provided in some embodiments of the disclosure, and FIG. 2 is a cross-sectional view of the display device 10a along line A-A in FIG. 1. The display device 10a includes a rear plate 100, a first support structure 210, a display panel 300, a backlight module 400, a flexible circuit board (FPC) 600, and a printed circuit board (PCB) 500. The backlight module 400 includes a light-emitting side 402 and a non-light-emitting side 404 opposite to the light-emitting side 402, and the display panel 300 is disposed on the light-emitting side 402 of the backlight module 400. The light-emitting side 402 refers to a side that emits light toward a display surface of the display panel 300 to allow the display panel 300 to display images, that is, a side of the display panel 300 facing a user. The non-light-emitting side 404 refers to a side opposite to the light-emitting side 402. The display panel 300 includes a first substrate 310 and a second substrate 320. The first substrate 310 is located between the second substrate 320 and the backlight module 400. The second substrate 320 extends beyond the first substrate 310 from a side of the second substrate 320 to form an extension portion 321. The rear plate 100 is disposed on the non-light-emitting side 404 of the backlight module 400. The backlight module 400 is sandwiched between the rear plate 100 and the display panel 300. The backlight module 400 has the light-emitting side 402, the non-light-emitting side 404, a first side 406, and a second side 408. The light-emitting side is opposite to the non-light-emitting side 404. The first side 406 is opposite to the second side 408. The light-emitting side is connected between the first side 406 and the second side 408. The non-light-emitting side 404 is connected between the first side 406 and the second side 408. Optionally, the light-emitting side 402 is perpendicularly connected between the first side 406 and the second side 408. The non-light-emitting side 404 is perpendicularly connected between the first side 406 and the second side 408. The first support structure 210 is disposed on the first side 406 of the backlight module 400 and is used to support the extension portion 321 of the display panel 300. The PCB 500 is used to drive and control the display panel 300 to display visual images. The PCB 500 is disposed on the first support structure 210. The PCB 500 can be fixed on the first support structure 210 by means of gluing, clamping, and the like. A projection of the PCB 500 and the first support structure 210 on a plane where the second substrate 320 is located falls within the extension portion 321. The plane where the second substrate 320 is located may be parallel to the second substrate 320.

The display device 10a is provided in the embodiments of the disclosure, to overcome a problem that existing display devices have excessively large bezels.

In the display device 10a provided in the embodiments of the disclosure, the display panel 300 is directly supported by the first support structure 210 on a rear plane, avoiding using a middle frame to support the display panel 300. At the same time, one end of the FPC 600 is disposed between the first support structure 210 and the extension portion 321 of the second substrate 320, so that a connection between the FPC 600 and the extension portion 321 is located inside the display device 10a, avoiding using a front frame to cover the FPC 600 and the extension portion 321. As such, in the display device 10a provided in the embodiments of the disclosure, the middle frame and the front frame can be omitted, so that a narrow bezel or bezel-less design of the display device 10a can be realized. In addition, in the display device 10a provided in the embodiments of the disclosure, the PCB 500 is disposed on the first support structure 210 to avoid disposing the PCB 500 on the back of the rear plate, thereby reducing an overall thickness of the display device 10a.

The FCB 600 is electrically connected to the display panel 300 and the PCB 500. The PCB 500 is electrically connected to the display panel 300 via the FCB 600. The FCB 600 includes a first portion 610 and a second portion 620. One end of the first portion 610 away from the second portion 620 is attached to the extension portion 321 and sandwiched between the first support structure 210 and the extension portion 321. One end of the second portion 620 away from the first portion 610 extends to the PCB 500. In an example, the second portion 620 extends to a side of the PCB 500 away from the first support structure 210. The second portion 620 may be directly electrically connected to a corresponding weld region on the PCB 500, or may be electrically connected to the PCB 500 via other connecting members. In an example, the PCB 500 is connected with the second portion 620 at one end of the PCB 500 close to the rear plate 100, so as to increase a connection length between the second portion 620 and the PCB 500, thereby increasing a stability of the electrical connection. In some embodiments, the PCB 500 may also be connected with the second portion 620 at one end of the PCB 500 away from the rear plate 100 to avoid interference between the second portion 620 and other components on the PCB 500. In some embodiments, the second portion 620 may extend to a side of the PCB 500 facing the first support structure 210. For example, the PCB 500 may has a weld region on the side of the PCB 500 facing the first support structure 210, and the second portion 620 may be welded on the weld region.

A traditional display device is provided with a middle frame for supporting a display panel and a front frame for covering edges of the display panel. However, the middle frame and the front frame may occupy a bezel space of the display device, which results in that a narrow bezel or bezel-less design of the display device cannot be realized. In the display device 10a provided in the embodiments of the disclosure, the display panel is directly supported by the first support structure, and one end of the FCB 600 is disposed between the first support structure 210 and the extension portion 321 of the second substrate 320, such that a connection between the FCB 600 and the extension portion 321 is located inside the display device 10a, avoiding using a front frame to cover the FCB 600 and the extension portion 321. As such, in the display device provided in the embodiments of the disclosure, the middle frame and the front frame can be omitted, so that a narrow bezel or bezel-less design of the display device can be realized. In addition, in the display device 10a provided in the embodiments of the disclosure, the PCB 500 is disposed on the first support structure 210, so that a relatively large overall thickness of the display device due to disposing the PCB on the back of the rear plate can be avoided, and at the same time, it is possible to reduce the number of times of bending the FCB 600, so that it needs to bend the FCB 600 once, and thus an operational stability of the circuit board 600 is improved.

The display device 10a further includes a second support structure 220 configured to support the display panel 300. The second support structure 220 is disposed on the second side 408 of the backlight module 400. As the first support structure 210 is disposed on the first side 406 of the backlight module 400, the second support structure 220 and the first support structure 210 are disposed on different sides of the backlight module 400. In some embodiments, the first support structure 210 and the second support structure 220 are disposed on two opposite sides of the backlight module 400. Orthographic projections of the first support structure 210, the second support structure 220, the FCB 600, and the PCB 500 on a plane where the display panel 300 is located all fall within the display panel 300. In an example, the plane where the display panel 300 is located may be parallel to the display panel.

In an implementation, one end of the first support structure 210 close to the second substrate 320 is farther close to the second substrate 320 than one end of the second support structure 220 close to the second substrate 320.

In an implementation, one end of the first support structure 210 close to the second substrate 320 is received inside the display device 10a, and one end of the second support structure 220 close to the second substrate 320 has a side exposed out of the display device 10a.

In an implementation, one end of the first substrate 310 away from the second support structure 220 is spaced apart from the first support structure 210.

In this embodiment, the rear plate 100 is integrally formed with the first support structure 210 and the second support structure 220. The rear plate 100 bends toward the display panel 300 at edges to form the first support structure 210 and the second support structure 220. In some embodiment, the rear plate 100, the first support structure 210, and the second support structure 220 can also be separate components. The first support structure 210 and the second support structure 220 may be fixedly connected with the rear plate 100 by means of bonding, clamping, welding, and the like. The first support structure 210 and the second support structure 220 may be disposed on a side of the rear plate 100 close to the display panel 300 or on sides of the rear plate 100.

The first support structure 210 and the second support structure 220 cooperatively serve as a support structure configured to support the display panel 300. Edges of the display panel 300 are lapped on the first support structure 210 and the second support structure 220. An orthographic projection of the first support structure 210 and the second support structure 220 on the display panel 300 may be in a shape of a straight line, a U shape, a polygon, an arc, and the like. The first support structure 210 and the second support structure 220 cooperatively define a shape which matches a shape of the display panel 300, so that surrounding edges of the display panel 300 are all supported to prevent the display panel 300 from receiving uneven forces. For example, if the display panel 300 is rectangular, a shape cooperatively defined by the first support structure 210 and the second support structure 220 is also rectangular. For another example, if the display panel 300 is triangular, the shape cooperatively defined by the first support structure 210 and the second support structure 220 is also triangular. Optionally, the first support structure 210 is in a substantially straight-line shape, the second support structure 220 is U-shaped, the first support structure 210 are connected with the second support structure 220 at two opposite ends of the first support structure 210 to form a substantially rectangular overall structure. The first support structure 210 can be abutted against and detachably connected with the second support structure 220, which facilitates disassembly and assembly.

Elastic cushions 230 are disposed between the display panel 300 and the first support structure 210 and/or the second support structure 220, so that a force exerted on the display panel 300 by the first support structure 210 and/or the second support structure 220 can be reduced when the display device 10a suffers from an external force, and thus damage to the edges of the display panel 300 due to direct collision between the display panel 300 and the first support structure 210 and/or the second support structure 220 can be avoided. In this embodiment, one cushion 230 is disposed between the display panel 300 and the first support structure 210, and one cushion 230 is disposed between the display panel 300 and the second support structure 220. Preferably, adhesive lays are provided between the cushions 230 and the display panel 300, an adhesive layer is provided between the cushion 230 and the first support structure 210, and an adhesive layer is provided between the cushion 230 and the second support structure 220, so that a connection between the display panel 300 and the first support structure 210 and a connection between the display panel 300 and the second support structure 220 are more stable. In some embodiments, the cushion 230 may be provided only between the display panel 300 and the first support structure 210, or only between the display panel 300 and the second support structure 220. For example, when the first support structure 210 supports most of sides of the display panel 300, the cushion 230 can be provided only on the first support structure 210, thereby simplifying a production process of the display device 10a and reducing production cost of the display device 10a.

The first support structure 210, the second support structure 220, and the rear plate 100 cooperatively define an accommodation space 110, and the backlight module 400 is accommodated in the accommodation space 110. In this embodiment, the backlight module 400 is configured as a direct-type backlight structure. The backlight module 400 includes an optical film 410 and a light-emitting substrate 420. The optical film 410 is sandwiched between the light-emitting substrate 420 and the display panel 300. The light-emitting substrate 420 is disposed on the side of the rear plate 100 close to the display panel 300. The first support structure 210 is disposed at a side of the light-emitting substrate 420 and a side of the optical film 410. The first support structure 210 is sandwiched between the light-emitting substrate 420 and the PCB 500. The optical film 410 includes a variety of optical plates such as a brightening plate, a quantum dot film, a diffuser plate, a homogenizing plate, and the like. The variety of optical plates cooperate with each other to adjust light rays emitted by the light-emitting substrate 420, so that a light-emitting surface of the backlight module 400 can emit uniform and bright light rays. Light-emitting units on the light-emitting substrate 420 can be any one of ordinary light-emitting diode (LED) lamps, mini LED lamps, micro LED lamps, and organic light emitting diode (OLED) lamps.

Specifically, the light-emitting substrate 420 is configured as a light plate, which is provided with multiple light-emitting units. The light-emitting unit on the light-emitting substrate 420 is a mini LED lamp. The mini LED lamp has advantages of small size and high luminous brightness, it can reduce a light-mixing distance between the light-emitting substrate 420 and the display panel 300, thereby reducing an overall thickness of the display device 10a. In an embodiment, the mini LED lamp is a blue mini LED lamp. The quantum dot film in the optical film 410 can be excited to emit green light rays and red light rays with high purity under an irradiation of blue light rays emitted by the blue mini LED lamp. High-purity red light rays, green light rays, and blue light rays can form high-quality white light rays after light mixing, so that the display device 10a has good optical color gamut and display effect. A relatively high luminous brightness of the blue mini LED lamp can also improve a display brightness of the display device 10a. In some embodiments, the mini LED lamp may be a green mini LED lamp or a red mini LED lamp, which is not limited herein.

In this embodiment, the second substrate 320 is configured as an array substrate, and the first substrate 310 is configured as a color filter substrate. The array substrate extends beyond the first support structure 210 at a side of the array substrate close to the first support structure 210 to form an extension portion 321. The extension portion 321 is provided with an outer lead bonding (OLB) region at a surface of the extension portion 321 facing the first support structure 210. The first portion 610 of the FCB 600 is electrically connected to the OLB region. The second portion 620 of the FCB 600 and the PCB 500 are disposed on the same side of the backlight module 400. The second portion 620 is electrically connected to the PCB 500. In the disclosure, the display panel 300 is flip-set, so that the color filter substrate is sandwiched between the array substrate and the backlight module 400. In this way, a side of the array substrate where a circuit layer is disposed can face an inside of the display device 10a, such that a connection between the FCB 600 and the OLB region is located inside the display device 10a, and thus the connection between the FCB 600 and the OLB region can be separated from an external environment without a front frame, and in turn the front frame in the conventional display device can be omitted.

A liquid crystal layer is disposed between the first substrate 310 and the second substrate 320. In this embodiment, the display panel 300 in the disclosure may be a twisted nematic (TN) liquid crystal display (LCD) panel, a vertical alignment (VA) LCD panel, an in-Plane switching (IPS) LCD panel, and a fringe field switching (FPS) LCD panel, or other types of LCD panels.

The display panel 300 also includes a first polarizer 330 and a second polarizer 340 opposite to the first polarizer 330. The first polarizer 330 is disposed on a side of the first substrate 310 away from the second substrate 320, and the second polarizer 340 is disposed on a side of the second substrate 320 away from the first substrate 310. An orthographic projection of the second polarizer 340 on the plane where the second substrate 320 is located coincides with the second substrate 320 to ensure that the display device 10a has a good display effect. In this embodiment, a light-shield plate 350 is disposed on a side of the display panel 300 to avoid light leakage at the surrounding edges of the display device 10a. The light-shield plate 350 can be implemented as a light-shielding glue layer, and the light-shielding glue is coated on a side of the display panel 300.

The display device 10a further includes a driver chip 700 for supplying driving signals to the display panel 300. The driver chip 700 may be disposed on the display panel 300 or on the PCB 500. In this embodiment, the driver chip 700 is connected to the FCB 600 to form a chip on film (COF) board. COF refers to a technology of die soft film packaging in which chips are directly fixed on a FCB and the FCB is used as a carrier for packaging chips, so that packaging and electrical connection of the chips are realized, and the COF board has both reliable electrical connection performance and good mechanical bending performance. The driver chip 700 is disposed on a side of the PCB 500 where components are provided. Preferably, the PCB 500 defines an avoidance groove 710 at a position corresponding to the driver chip 700, and the driver chip 700 is disposed in the avoidance groove 710 to avoid interference between the driver chip 700 and other components on the PCB 500. In some embodiments, the driver chip 700 may also be directly packaged on the PCB 500 through a chip on board (COB) technology, so as to reduce a manufacturing cost of the display device 10a. In some embodiments, the driver chip 700 may also be disposed on the extension portion 321 and connected to the OLB region through a chip on glass (COG) technology.

Figure 3:
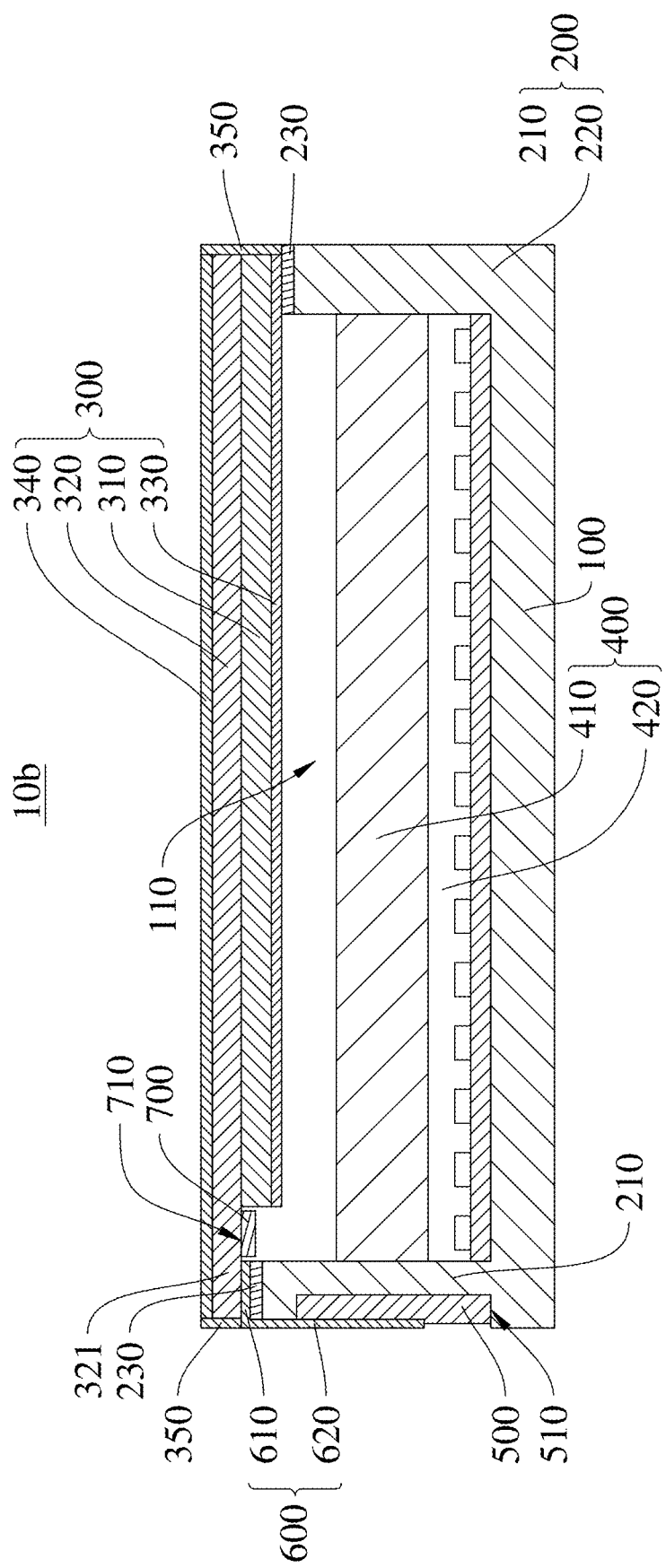
FIG. 3 is a cross-sectional view of a display device provided in some embodiments of the disclosure.

Refer to FIG. 3, which is a schematic structural view of a display device 10b provided in some embodiments of the disclosure. The display device 10b in FIG. 3 is similar in structure to the display device 10a in FIG. 1, except that the first support structure 210 defines a mounting groove 510, and the PCB 500 is at least partially accommodated in the mounting groove 510, such that an actual frame width of the display device 10b can be further reduced.

Specifically, the mounting groove 510 is defined on a surface of the first support structure 210 away from the backlight module 400. In an embodiment, the mounting groove 510 is a blind groove, that is, the mounting groove 510 does not penetrate the first support structure 210. In some embodiments, the mounting groove 510 may be a through groove, that is, the mounting groove 510 penetrates the first support structure 210. Preferably, the mounting groove 510 matches the PCB 500 in shape and size, and the PCB 500 is snapped into the mounting groove 510. In an example, a surface of the PCB 500 on which components (not illustrated) are disposed faces away from the backlight module 400, which facilitates maintenance of the PCB 500 by technicians. In some embodiments, the mounting groove 510 may be defined on a surface of the first support structure 210 away from the backlight module 400, and the mounting groove 510 does not penetrate the first support structure 210.

The first support structure 210, the second support structure 220, the display panel 300, and the rear plate 100 cooperatively define the accommodation space 110 that is isolated from the external environment. The backlight module 400, the PCB 500, and the FCB 600 are all accommodated in the accommodation space 110, so that there is no need to provide additional protection structures for isolating the PCB 500 and the FCB 600 from the external environment.

The mounting groove 510 may be formed by removing part of the first support structure 210, or may be formed by bending the first support structure 210. For example, the mounting groove 510 may be formed by bending one end of the first support structure 210 close to the display panel 300 in a direction away from the backlight module 400.

In FIG. 3, the driver chip 700 is disposed on the extension portion 321 and is electrically connected to the OLB region. In this way, disposing the driver chip 700 on the extension portion 321 can reduce the frame width of the display device 10b without increasing the overall thickness of the display device 10b.

Figure 4:
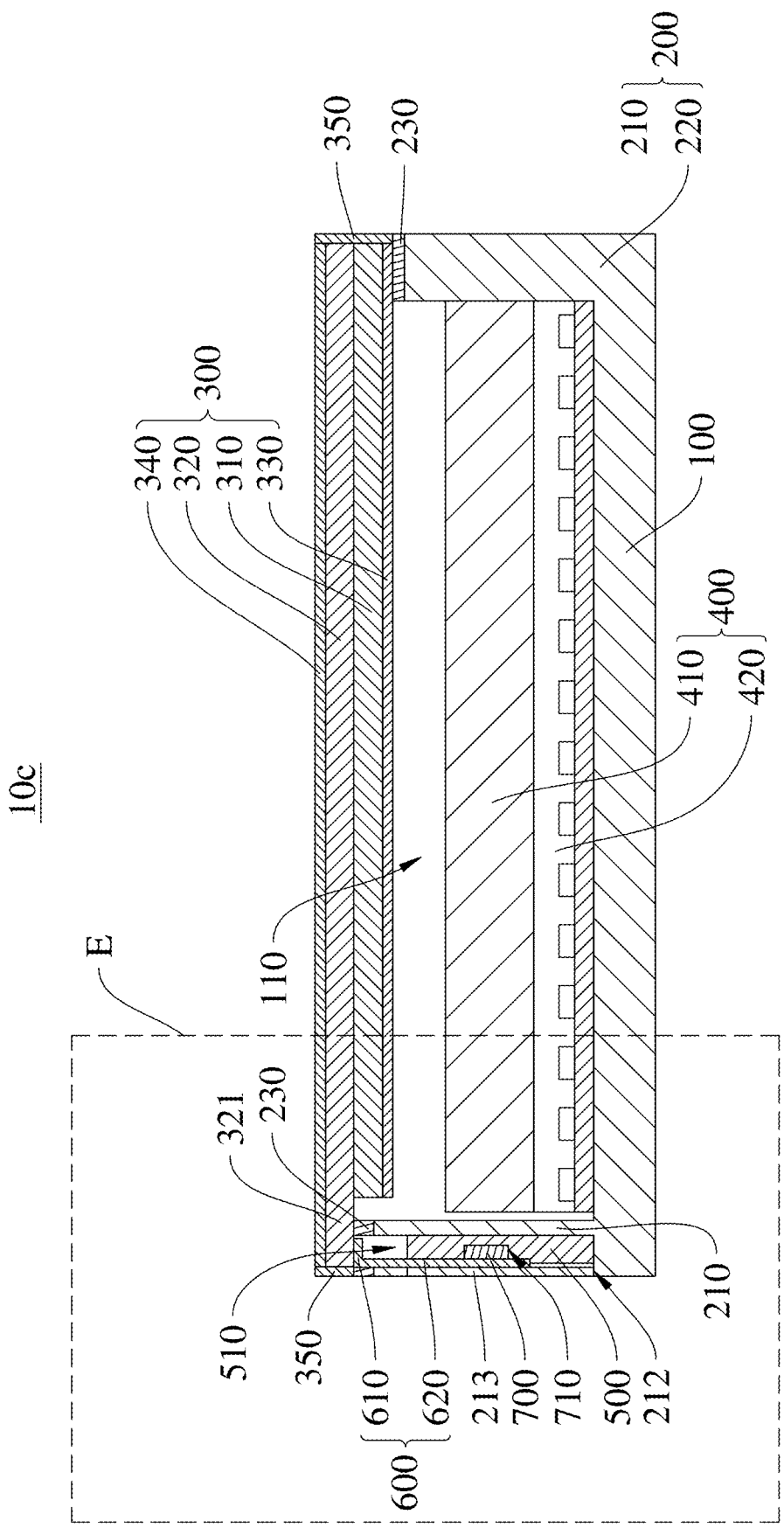
FIG. 4 is a cross-sectional view of a display device provided in some embodiments of the disclosure.
Figure 5:
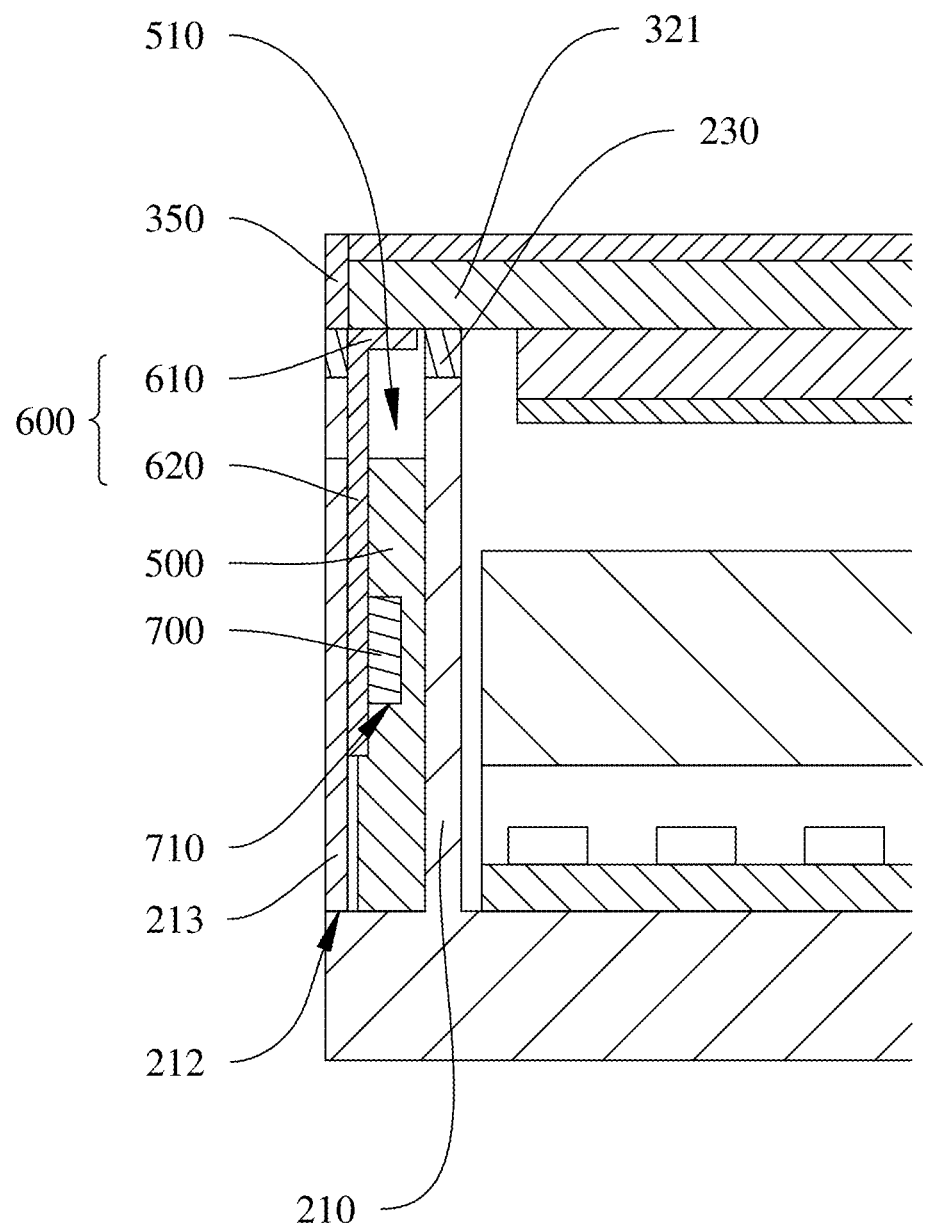
FIG. 5 is an enlarged view of the display device at E in FIG. 4.

Refer to FIG. 4 and FIG. 5, FIG. 4 is a schematic structural view of the display device provided in some embodiments of the disclosure, and FIG. 5 is an enlarged view of the display device at E in FIG. 4. The display device 10c in FIG. 4 is similar in structure to the display device 10a in FIG. 1, except that the first support structure 210 defines a mounting groove 510 and the mounting groove 510 extends from an end surface of the first support structure 210 close to the display panel 300 in a direction away from the display panel 300, and the FCB 600 and the PCB 500 are both disposed in the mounting groove 510. After being electrically connected to the OLB region, the FCB 600 is directly electrically connected to the PCB 500, so that there is no need to bend the FCB 600, which avoids damage to the FCB 600 during bending. Preferably, the first support structure 210 defines an access hole 212 on a side of the first support structure 210 away from the backlight module 400, where the access hole 212 is at a position corresponding to the PCB 500, so that the technicians can perform maintenance on the PCB 500 without completely disassembling the display device 10c. The first support structure 210 is also provided with a sealing element 213 for sealing the access hole 212. When the technicians do not maintain the PCB 500, the sealing element 213 blocks the access hole 212 to prevent the PCB 500 from being polluted by external dust, water vapor, and other pollutants.

Figure 6:
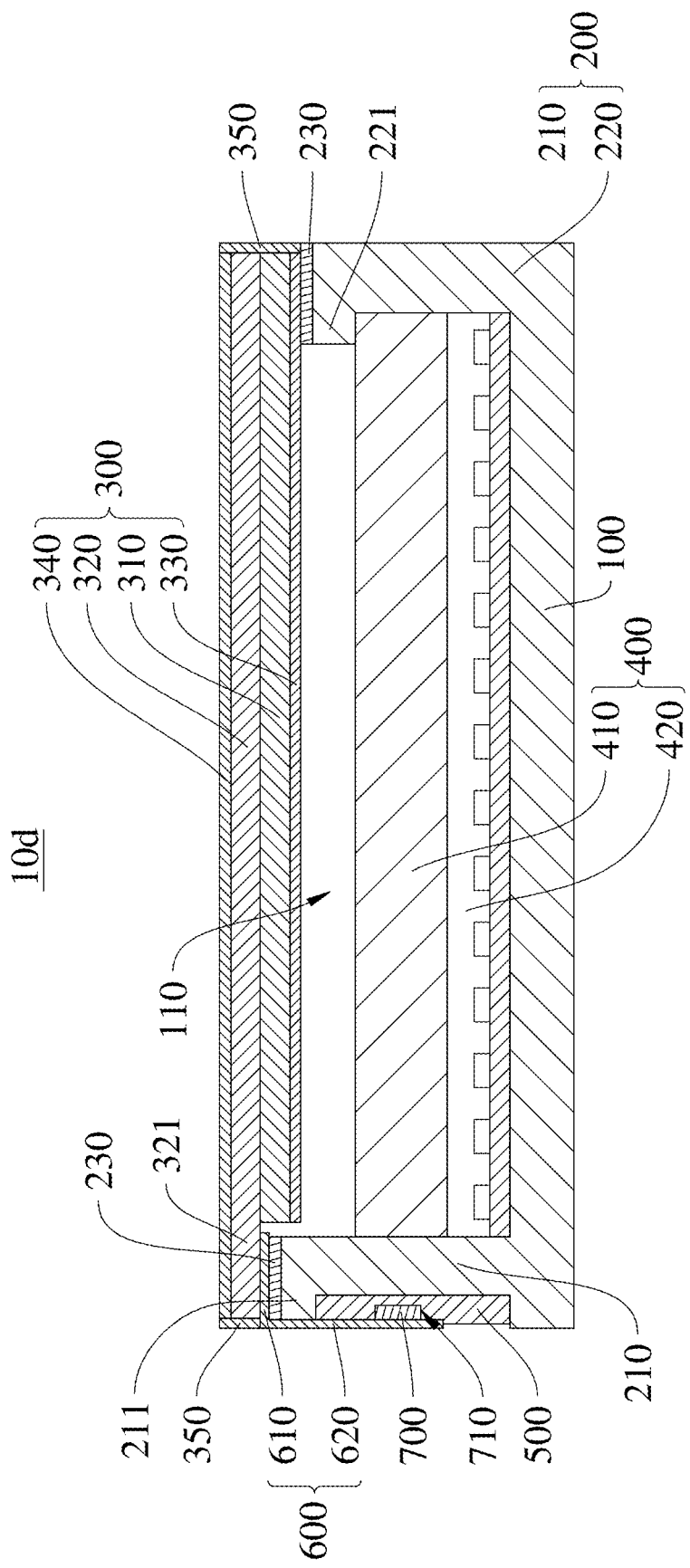
FIG. 6 is a cross-sectional view of a display device provided in some embodiments of the disclosure.

Refer to FIG. 6, which is a schematic structural view of a display device 10d provided in some embodiments of the disclosure. The display device 10d provided in FIG. 6 is similar in structure to the display device 10a in FIG. 1, except that one end of the first support structure 210 and/or the second support structure 220 close to the display panel 300 is bent to form an extension structure. The extension structure is used to increase a contact area between the display panel 300 and the first support structure 210 and/or the second support structure 220, so as to enhance a supporting effect of the first support structure 210 and/or the second support structure 220 on the display panel 300. Specifically, the first support structure 210 is provided with a first extension structure 211 at one end of the first support structure 210 close to the display panel 300, and the second support structure 220 is provided with a second extension structure 221 at one end of the second support structure 220 close to the display panel 300. Orthographic projections of the first support structure 210, the first extension structure 211, the second support structure 220, and the second extension structure 221 on the display panel 300 all fall within the display panel 300.

Specifically, the first support structure 210 is provided with the first extension structure 211 at one end of the first support structure 210 close to the display panel 300, and the second support structure 220 is provided with the second extension structure 221 at one end of the second support structure 220 close to the display panel 300. In an example, an orthographic projection of the first extension structure 211 on the plane where the display panel 300 is located is at least partially located outside an orthographic projection of the first support structure 210 on the plane where the display panel 300 is located, and an orthographic projection of the second extension structure 221 on the plane where the display panel 300 is located is at least partially outside an orthographic projection of the second support structure 220 on the plane where the display panel 300 is located, such that the contact area between the display panel 300 and the first support structure 210 and/or the second support structure 220 is increased. The cushions 230 are provided between the first extension structure 211 and the display panel 300 and between the second extension structure 221 and the display panel 300.

Preferably, the first support structure 210 and the first extension structure 211 are integrally formed, and the second support structure 220 and second extension structure 221 are integrally formed. One end of the first support structure 210 close to the display panel 300 bends toward a direction away from the backlight module 400 to form the first extension structure 211. A side of the first extension structure 211 away from the backlight module 400 is flush with a side of the second substrate 320. A side of the first support structure 210 away from the backlight module 400 and the first extension structure 211 cooperatively define a space, which can be used as a mounting groove for accommodating the PCB 500. One end of the second support structure 220 close to the display panel 300 bends toward the backlight module 400 to form the second extension structure 221. A side of the second support structure 220 away from the backlight module 400 is flush with a side of the second substrate 320 of the display panel 300, so as to reduce the frame width of display device 10d. In some embodiments, one end of the first support structure 210 close to the display panel 300 may bend toward the backlight module 400 to form the first extension structure 211.

In some embodiments, the first extension structure 211 and the first support structure 210 can be separate structures, and the first extension structure 211 and the first support structure 210 are fixedly connected together by means of bonding, clamping, welding, and the like. The second extension structure 221 and the second support structure 220 can be separate structures, and the second extension structure 221 and the second support structure 220 are fixedly connected together by means of bonding, clamping, welding, and the like.

Figure 7:
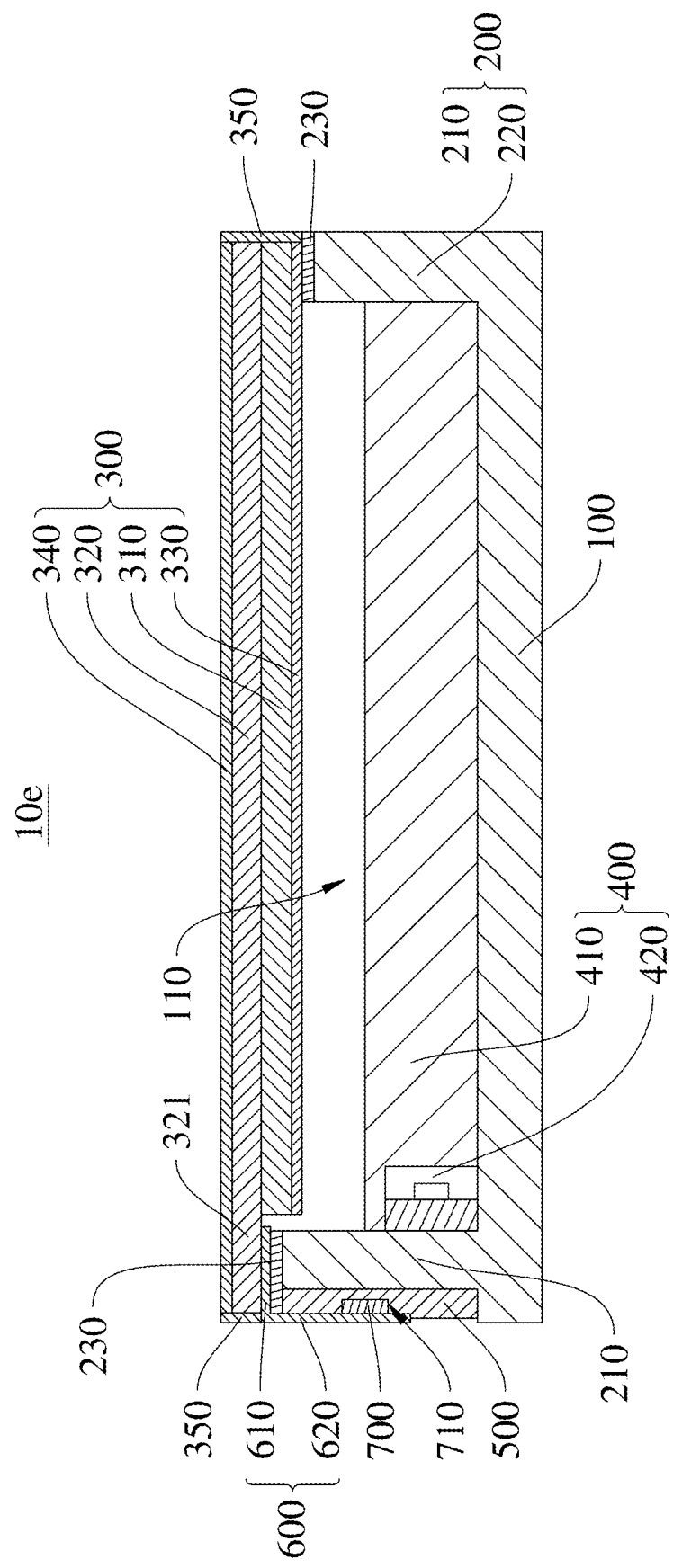
FIG. 7 is a cross-sectional view of a display device provided in some embodiments of the disclosure.

Refer to FIG. 7, which is a schematic structural view of a display device 10e provided in some embodiments of the disclosure. The display device 10e in FIG. 7 is similar in structure to the display device 10a in FIG. 1, except that the backlight module 400 is configured as a side-type backlight structure. In the side-type backlight structure, the light-emitting substrate 420 is disposed on a side of the optical film 410, which can reduce a thickness of the backlight module 400, thereby reducing an overall thickness of the display device 10e.

The light-emitting substrate 420 is configured as a light bar, and the light bar is provided with light-emitting units at intervals. In this embodiment, the light bar is implemented as one light bar. The light bar is sandwiched between the optical film 410 and the first support structure 210. The first support structure 210 separates the light bar from the PCB 500. In some embodiment, the light bar can be sandwiched between the optical film 410 and the second support structure 220, so that the light bar and the PCB 500 are located on different sides of the optical film 410, and thus avoiding that a normal operation of the PCB 500 is affected by heat generated by the light bar during light-emitting. In some embodiments, the light bar can also be implemented as multiple light bars. Preferably, the number of light bars corresponds to the number of side surfaces of the optical film 410, and each side surface of the optical film 410 is provided with one light bar, so that the optical film 410 can emit more uniform and bright light.

Figure 8:
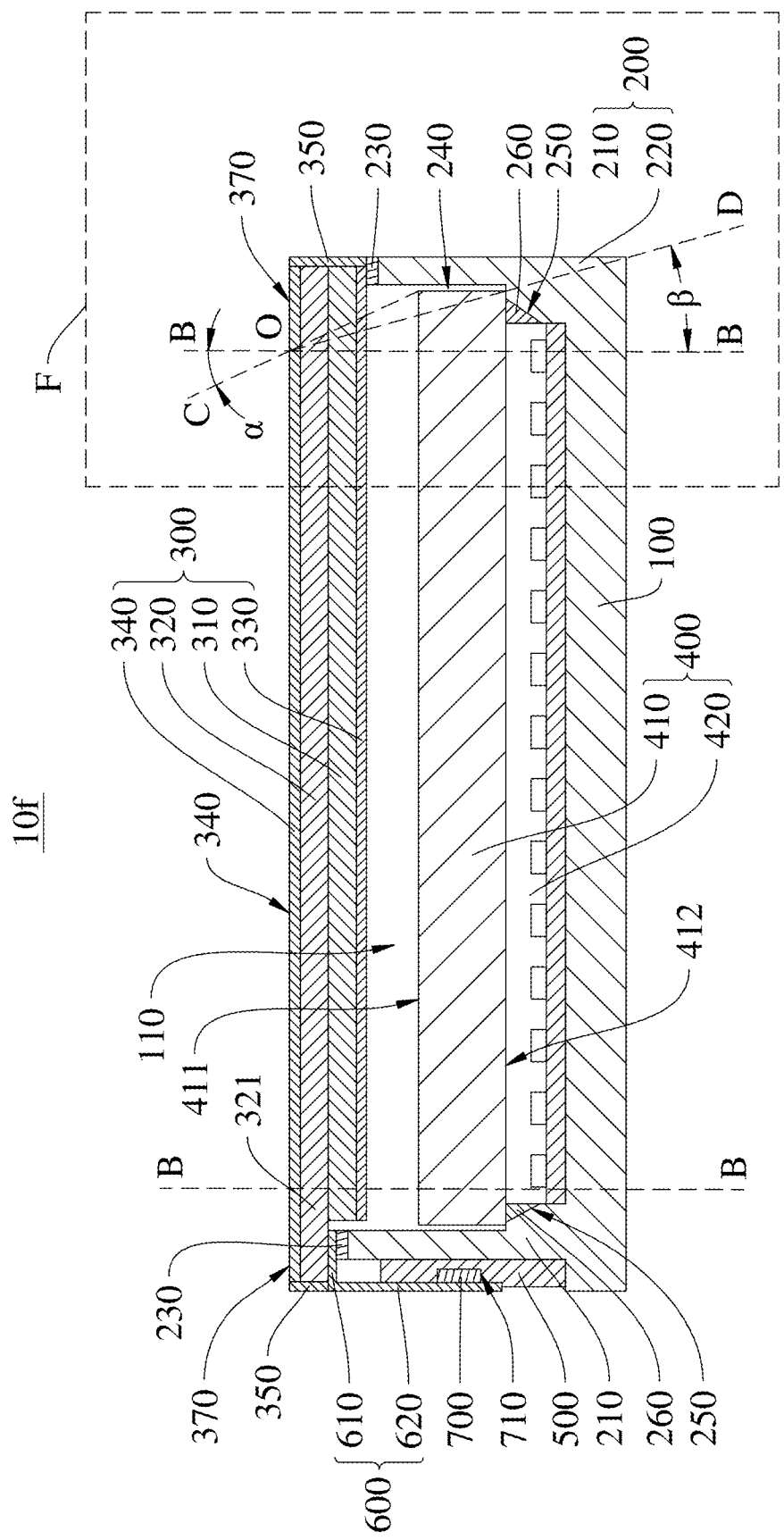
FIG. 8 is a cross-sectional view of a display device provided in some embodiments of the disclosure.
Figure 9:
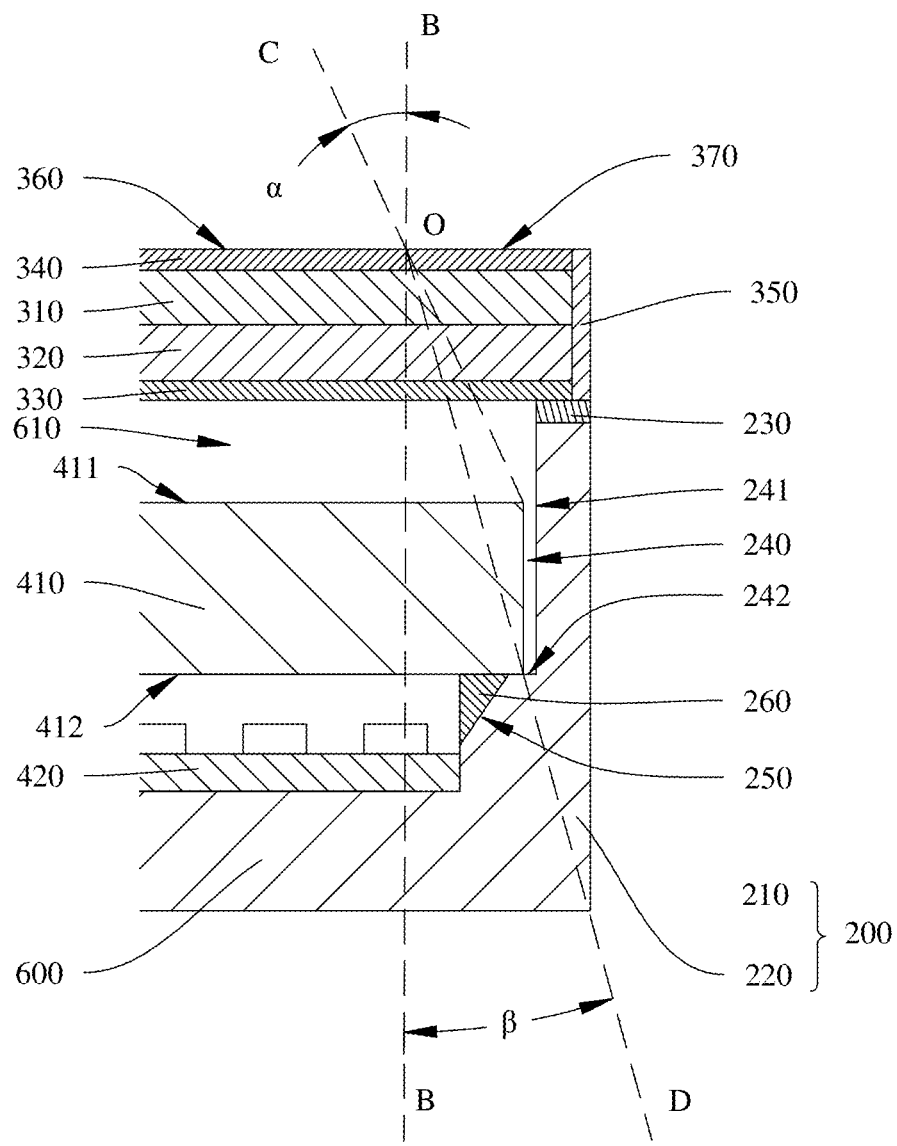
FIG. 9 is an enlarged view of the display device at F in FIG. 8.

Refer to FIG. 1, FIG. 8, and FIG. 9, a display device 10f in FIG. 8 is similar in structure to the display device 10a in FIG. 1, except that the first support structure 210 and/or the second support structure 220 defines a support groove 240 at a position corresponding to the optical film 410. An edge of the optical film 410 is received in the support groove 240. The support groove 240 includes a support surface configured to support the optical film 410, a surface of the optical film 410 away from the display panel 300 is attached to the support surface, so that all light rays emitted by the light-emitting substrate 420 pass through the optical film 410 to avoid light leakage at the surrounding edges of the display device 10f. In an example, the support surface is a groove wall of the support groove 240 away from the display panel 300.

It can be understood that, due to design errors and manufacturing errors, it is difficult to ensure that the side surface of the optical film 410 is completely attached to the first support structure 210 or the second support structure 220 during an actual assembly process of the display device 10f. Therefore, at the surrounding edges of the display device 10f, part of the light rays emitted by the light-emitting substrate 420 can be directly irradiated on the display panel 300, resulting in a phenomenon of light leakage at the surrounding edges of the display device 10f. In this embodiment, by defining the support groove 240 and disposing the edge of the optical film 410 in the support groove 240, it makes the optical film 410 partially coincide with the orthographic projection of the second support structure 220 on the plane where the display panel 300 is located, so that all the light rays emitted by the light-emitting substrate 420 pass through the optical film 410, and thus a problem of light leakage at the surrounding edges of the display device 10f is solved.

In this embodiment, the first support structure 210 and the second support structure 220 each define the support groove 240 to better support the optical film 410, and at the same time, it makes the optical film 410 space apart from the light-emitting substrate 420, so that a light-mixing distance between the optical film 410 and the light-emitting substrate 420 can be easily adjusted. Preferably, the support groove 240 does not penetrate the first support structure 210, that is, the first support structure 210 separates the PCB 500 from the optical film 410. In some embodiments, the first support structure 210 defines a mounting groove 510 for mounting the PCB 500, and the support groove 240 is spaced apart from the mounting groove 510 to prevent the light rays emitted by the light-emitting substrate 420 from leaking out of the mounting groove 510.

The support groove 240 has a first groove wall 241 and a second groove wall 242. The first groove wall 241 is parallel to the side surface of the optical film 410, or the first groove wall 241 is substantially parallel to a light-emitting direction of the display device 10f. The second groove wall 242 is parallel to the surface of the optical film 410 away from the display panel 300, and the second groove wall 242 is a support surface configured to support the optical film 410. The optical film 410 is attached to the second groove wall 242 to prevent the light rays emitted by the light-emitting substrate 420 from passing through a gap between the optical film 410 and the second groove wall 242.

The display panel 300 includes a display region 360 and a non-display region 370. The non-display region 370 surrounds surrounding edges of the display region 360. A dashed box in FIG. 1 and dashed line B-B in FIG. 8 indicate boundary lines between the display region 360 and the non-display region 370. A region inside the dashed box indicates the display region 360, and a region between the dashed box and edges of the display device 10f indicates the non-display region 370.

Refer to FIG. 9, in this embodiment, the optical film 410 extends beyond line B-B, that is, an edge portion of the optical film 410 extends from the display region 360 to the non-display region 370. In an example, an extension length of the optical film 410 is a preset value. Specifically, the optical film 410 includes a first surface 411 and a second surface 412 opposite to the first surface 411. The first surface 411 is at a side of the optical film 410 close to the display panel 300, and the second surface 412 is at a side of the optical film 410 away from the display panel 300. Line B-B and straight line O-C connecting a junction between the first surface 411 and the side surface of the optical film 410 and junction O between the display region 360 and the non-display region 370 defines angle α greater than or equal to 45 degrees, and line B-B and straight line O-D connecting a junction between the second surface 412 and the side surface of the optical film 410 and junction O between the display region 360 and the non-display region 370 defines an angle greater than 30 degrees, so that the user can have a good viewing experience when viewing the display device 10f from various viewing angles. In an example, junction O between the display region 360 and the non-display region 370 indicates a junction between the display region 360 and the non-display region 370 on a light-emitting surface of the display panel 300. Preferably, line B-B and a straight line connecting an edge of the quantum dot film (not illustrated) in the optical film 410 and junction O define an angle greater than or equal to 30 degrees.

Figure 10:
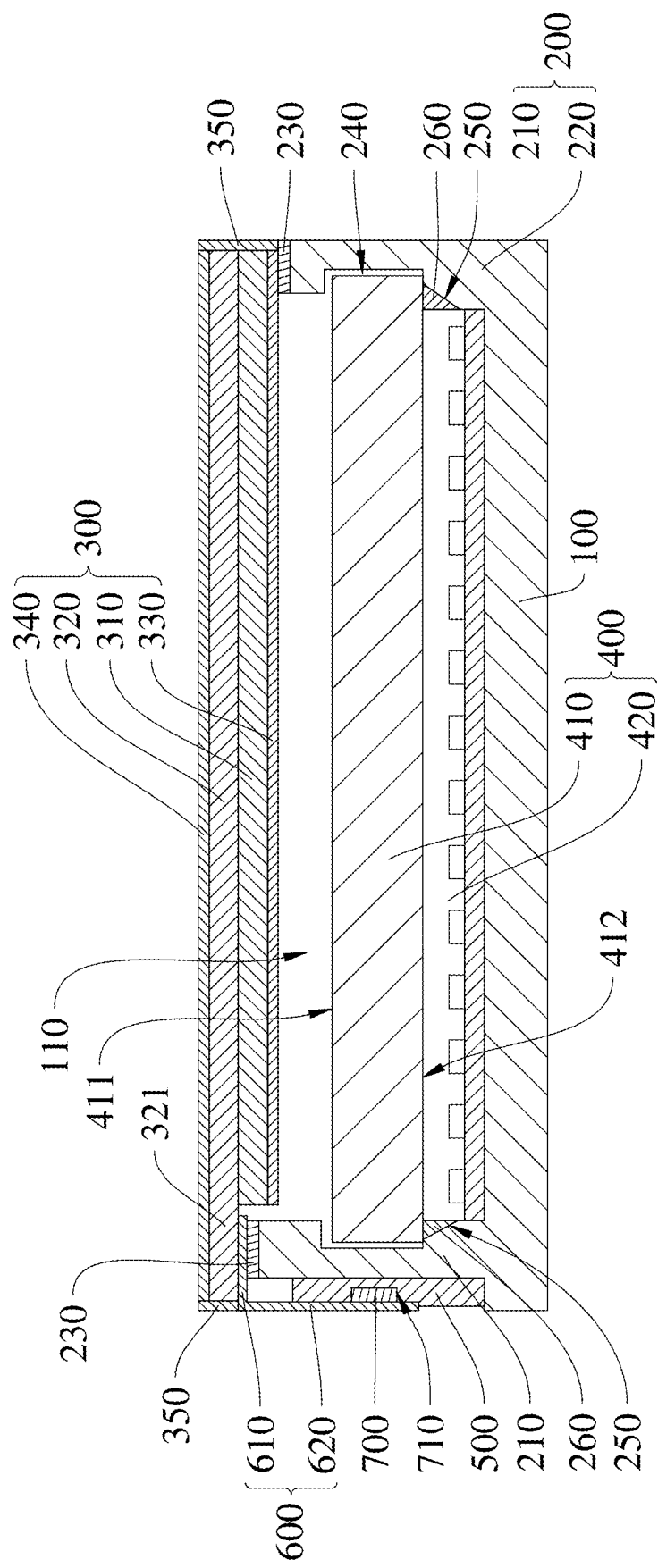
FIG. 10 is a cross-sectional view of a display device provided in some embodiments of the disclosure.

In this embodiment, the support groove 240 extends from one end of the first support structure 210 close to the display panel 300 toward the other end of the first support structure 210 away from the display panel 300 and extends from one end of the second support structure 220 close to the display panel 300 toward the other end of the second support structure 220 away from the display panel 300. The support groove 240 penetrates an end surface of the first support structure 210 close to the display panel and an end surface of the second support structure 220 close to the display panel. The first support structure 210 and the second support structure 220 are stepped. In this way, there is no obstruction between the optical film 410 and the display panel 300 by the first support structure 210 and the second support structure 220, and the light rays transmitted from the first surface 411 of the optical film 410 can directly incident on the display panel 300. As illustrated in FIG. 10, in some embodiments, the support groove 240 may be a groove defined on a side of the first support structure 210 facing the optical film 410 and a side of the second support structure 220 facing the optical film 410, that is, there is an obstruction between the optical film 410 and the display panel 300 by the first support structure 210 and the second support structure 220. A groove wall of the support groove 240 close to the display panel 300 is spaced apart from the optical film 410, which can prevent the groove wall from blocking light rays emitted from the edge of the optical film 410 and affecting light output effects of the optical film 410.

The second groove wall 242 is provided with a light transmission groove 250. A side of the light transmission groove 250 facing the accommodation space 110 is exposed to the accommodation space 110, so that the light rays emitted by the light-emitting substrate 420 can enter the optical film 410 through the light transmission groove 250, the optical film 410 can be brought into full play, and light output flux at the surrounding edges of the display device 10f is increased, and thus a problem of dark edges appearing at the surrounding edges of the display device 10f is avoided. The light transmission groove 250 extends from a side surface of the first support structure 210 facing the accommodation space 110 to a side surface of the first support structure 210 away from the accommodation space 110 and extends from a side surface of the second support structure 220 facing the accommodation space 110 to a side surface of the second support structure 220 away from the accommodation space 110. A depth of the light transmission groove 250 is smaller than a depth of the optical film 410 embedded in the support groove 240, that is, an orthographic projection of the light transmission groove 250 on a plane where the optical film 410 is located falls within the optical film 410, and an edge of the second surface 412 of the optical film 410 is always in contact with the second groove wall 242. A cross section of the light transmission groove 250 may be in a shape of a triangle, a rectangle, a trapezoid, a polygon, an irregular shape, or the like.

Preferably, a light transmission adhesive layer 260 is provided in the light transmission groove 250. A side surface of the light transmission adhesive layer 260 facing the optical film 410 is flush with the second groove wall 242 to support the optical film 410 together with the second groove wall 242, which can avoid an excessive small contact area between the optical film 410 and the support groove 240. The second surface 412 of the optical film 410 is attached to the light transmission adhesive layer 260, and part of the light rays emitted by the light-emitting substrate 420 can enter the optical film 410 through the light transmission adhesive layer 260.

While the disclosure has been described in detail above with reference to the exemplary embodiments, the scope of the disclosure is not limited thereto. As will occur to those skilled in the art, the disclosure is susceptible to various modifications and changes without departing from the spirit and principle of the disclosure. Therefore, the scope of the disclosure should be determined by the scope of the claims.

What is claimed is:
1. A display device, comprising:
a backlight module;
a display panel disposed on a light-emitting side of the backlight module and comprising a first substrate and a second substrate, the first substrate being located between the second substrate and the backlight module, and the second substrate extending beyond the first substrate from a side of the second substrate to form an extension portion;

a first support structure disposed on a first side of the backlight module and configured to support the extension portion;

a printed circuit board (PCB) disposed on the first support structure;

a flexible circuit board (FCB) electrically connected to the display panel and the PCB, the FCB being sandwiched between the first support structure and the extension portion at one end of the FCB and extending to the PCB at the other end of the FCB; and a second support structure configured to support the display panel, wherein the backlight module further has a second side opposite the first side, the light-emitting side is connected between the first side and the second side, the second support structure is disposed on the second side of the backlight module, and the first support structure and the second support structure cooperatively define an accommodation space for accommodating the backlight module;

wherein the first support structure has one end closer to the second substrate than another end of the first support structure, the one end of the first support structure is received inside the display device, the second support structure has one end closer to the second substrate than another end of the second support structure, and the one end of the second support structure has a side exposed out of the display device.

2. The display device of claim 1, wherein one cushion is disposed between the display panel and the first support structure, and one cushion is disposed between the display panel and the second support structure.

3. The display device of claim 1, wherein the one end of the first support structure is closer to the second substrate than the one end of the second support structure.

4. The display device of claim 1, wherein one end of the first substrate away from the second support structure is spaced apart from the first support structure.

5. The display device of claim 1, further comprising a rear plate, wherein the first support structure, the second support structure, and the rear plate are integrally formed.

6. The display device of claim 1, wherein orthographic projections of the first support structure, the second support structure, and the PCB on the display panel fall within the display panel.

7. The display device of claim 1, wherein the backlight module comprises an optical film and a light-emitting substrate; and at least one of the first support structure or the second support structure defines a support groove at a position corresponding to the optical film, the support groove has a support surface configured to support the optical film, and the optical film is attached to the support surface.

8. The display device of claim 7, wherein the support surface defines a light transmission groove in communication with the accommodation space, an orthographic projection of the light transmission groove on the optical film falls within the optical film, the light transmission groove is filled with a light transmission adhesive layer, the optical film is attached to the light transmission adhesive layer, so that part of light rays emitted from the light-emitting substrate passes through the light transmission adhesive layer to enter the optical film.

9. The display device of claim 7, wherein the first support structure defines a mounting groove for accommodating the PCB, and the PCB is at least partially accommodated in the mounting groove.

10. The display device of claim 9, wherein the support groove is spaced apart from the mounting groove.

11. The display device of claim 9, wherein the PCB and the FCB are all accommodated in the mounting groove.

12. The display device of claim 1, wherein the backlight module is configured as a direct-type backlight module or a side-type backlight module.

13. The display device of claim 1, wherein the display panel further comprises a first polarizer and a second polarizer opposite to the first polarizer, the first polarizer is disposed on a side of the first substrate away from the second substrate, the second polarizer is disposed on a side of the second substrate away from the first substrate, and an orthographic projection of the second polarizer on the second substrate coincides with the second substrate.

14. The display device of claim 1, further comprising a driver chip, the driver chip being disposed on a side of the extension portion facing the first support structure.

15. The display device of claim 1, further comprising a driver chip, the driver chip being disposed on the PCB.

16. The display device of claim 1, wherein a projection of the PCB and a projection of the first support structure on a plane where the second substrate is located all fall within the extension portion.

17. The display device of claim 1, wherein the backlight module comprises an optical film and a light-emitting substrate, the optical film is sandwiched between the light-emitting substrate and the display panel; and the first support structure is sandwiched between the light-emitting substrate and the PCB.

18. The display device of claim 1, wherein the FCB comprises a first portion and a second portion;

one end of the first portion away from the second portion is attached to the extension portion and sandwiched between the first support structure and the extension portion;

one end of the second portion away from the first portion extends to the PCB; and the PCB is connected with the second portion at one end of the PCB away from the first support structure.

* * * * *